US009165969B2

(12) United States Patent
Mao et al.

(10) Patent No.: US 9,165,969 B2
(45) Date of Patent: Oct. 20, 2015

(54) APPARATUS HAVING THINNER INTERCONNECT LINE FOR PHOTODETECTOR ARRAY AND THICKER INTERCONNECT LINE FOR PERIPHERY REGION

(75) Inventors: Duli Mao, Sunnyvale, CA (US); Vincent Venezia, Sunnyvale, CA (US); Howard Rhodes, San Martin, CA (US); Hsin Chih Tai, Cupertino, CA (US); Yin Qian, Milpitas, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 1146 days.

(21) Appl. No.: 12/727,115

(22) Filed: Mar. 18, 2010

(65) Prior Publication Data
US 2011/0227184 A1    Sep. 22, 2011

(51) Int. Cl.
H01L 27/146    (2006.01)
(52) U.S. Cl.
CPC .... *H01L 27/14636* (2013.01); *H01L 27/14683* (2013.01)
(58) Field of Classification Search
USPC .......... 257/428, 431, 443, E27.133, E31.113; 438/73, 98
See application file for complete search history.

(56) References Cited

U.S. PATENT DOCUMENTS

| 5,504,355 A | 4/1996 | Hatano |
| 6,058,229 A | 5/2000 | Burrows et al. |
| 6,627,474 B2 | 9/2003 | Barna et al. |
| 7,345,330 B2 | 3/2008 | Rhodes |
| 2004/0120179 A1 | 6/2004 | Ishigaki et al. |
| 2004/0127001 A1* | 7/2004 | Colburn et al. ............... 438/586 |
| 2007/0052035 A1 | 3/2007 | Nagaraja et al. |
| 2009/0200625 A1* | 8/2009 | Venezia et al. ............... 257/432 |
| 2009/0256226 A1 | 10/2009 | Tatani et al. |

FOREIGN PATENT DOCUMENTS

| CN | 101740586 | 6/2010 |
| TW | 200411664 | 7/2004 |
| TW | 201010068 | 3/2010 |

OTHER PUBLICATIONS

Taiwan (ROC) Office Action of the Intellectual Property Office (Translation) and Search Report, Taiwan (ROC) Application No. 099116406, Issued May 2, 2013. 4 pages.
First Office Action of China State Intellectual Property Office (Translation) and Search Report, Chinese Application No. 201001265986.7, Issued Jan. 1, 2013. 3 pages.
CN Application No. 201010265986.7—Second Chinese Office Action, with English Translation, issued Nov. 21, 2013 (7 pages).
CN Application No. 201010265986.7—Third Chinese Office Action, with English Translation, issued May 8, 2014 (5 pages).

* cited by examiner

*Primary Examiner* — Lynne Gurley
*Assistant Examiner* — Vernon P Webb
(74) *Attorney, Agent, or Firm* — Blakely Sokoloff Taylor & Zafman LLP

(57) ABSTRACT

An apparatus of one aspect includes a photodetector array, and a peripheral region at a periphery of the photodetector array. A thinner interconnect line corresponding to the photodetector array is disposed within one or more insulating layers. A thicker interconnect line corresponding to the peripheral region is disposed within the one or more insulating layers. Other apparatus, methods, and systems are also disclosed.

16 Claims, 8 Drawing Sheets

APPARATUS HAVING THINNER INTERCONNECT LINE FOR PHOTODETECTOR ARRAY AND THICKER INTERCONNECT LINE FOR PERIPHERY REGION

BACKGROUND

1. Field

Embodiments of the invention relate to an apparatus having a photodetector array. In particular, embodiments of the invention relate to interconnect lines for an apparatus having a photodetector array.

2. Background Information

Photodetector arrays are prevalent. The photodetector arrays may be used in a wide variety of applications. Commonly, the photodetector arrays may be used to acquire images or video for various electronic devices, such as, for example, digital cameras, camera phones, security cameras, camcorders, medical imaging devices, etc. Examples of other applications include motion detection, position sensing (e.g., an optical mouse), and other consumer electronics, medical, automobile, military, or other applications.

In photodetector arrays, there is a trend toward smaller pixel sizes. The smaller pixel sizes may help to provide higher pixel densities, higher image resolution, and/or may help to reduce the cost of providing the photodetector arrays.

One challenge with reducing the pixel size is that the area available for collection of light for each pixel or photodetector is typically also reduced. This tends to reduce the total amount of energy collected by each pixel or photodetector during photodetection, which may tend to reduce the sensitivity of the photodetector array.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
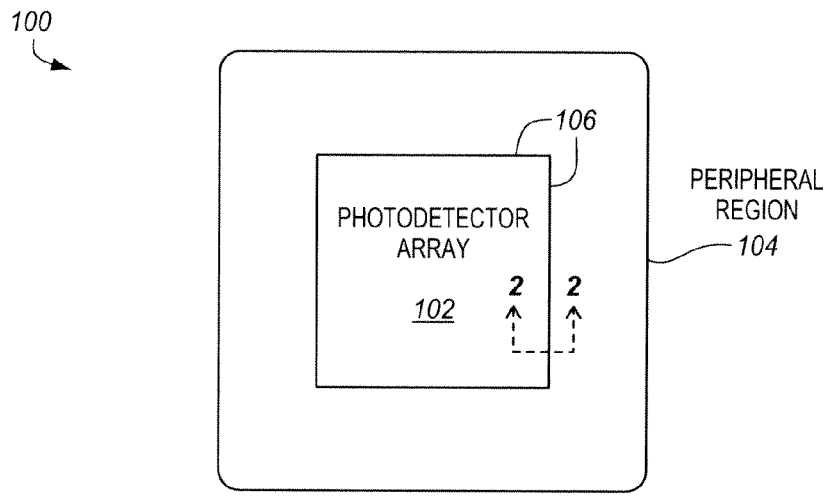
FIG. 1 is a top planar view of an embodiment of a photodetector apparatus.

FIG. 1 is a top planar view of an embodiment of a photodetector apparatus 100. The photodetector apparatus may represent a die, integrated circuit, or package or component thereof, which may be incorporated into various different types of electronic devices, such as, for example, image or video acquisition devices, position sensing devices, motion detection devices, etc.

The photodetector apparatus includes a photodetector array 102. The photodetector array may have an array of photodiodes, charge-coupled devices (CCDs), quantum device optical detectors, photogates, phototransistors, photoconductors, or other photodetectors. Each of the photodetectors may correspond to a pixel to provide an array of pixels. Various different types of conventional photodetector arrays are suitable.

The photodetector apparatus also includes a peripheral region 104. The peripheral region is located at or along a periphery 106 of the photodetector array 102. In the illustrated apparatus, the photodetector array is located generally centrally, and the peripheral region entirely surrounds the photodetector array along its periphery. Alternatively, in other embodiments, the peripheral region may be located at or along only a portion of the periphery of the photodetector array, such as, for example, along one, two, or three sides, or along portion(s) of one or more sides.

The peripheral region may have one or more peripheral circuits (not shown). The peripheral circuits may perform various operations associated with and/or to support the photodetector array. By way of example, the peripheral circuit may include circuitry to read or access charges or other signals generated by the photodetector array or pixels thereof as a result of photodetection. For example, the circuitry may include row and column readout circuitry to read charges held by capacitors of the pixels of the array. As other examples, the circuitry may include scanning circuits, amplifiers, switches, decoders, signal conditioning circuitry, and the like. Various different types of conventional peripheral circuits are suitable.

Interconnects (not shown in this view) are typically included to provide electrical connections to the photodetector array and the peripheral circuit(s) of the peripheral region. The interconnects may include conductive lines, or other structures, or other paths, or combinations thereof, which may be used to convey electrical signals to and/or from the photodetector array and the peripheral circuit(s). The interconnects may be formed of one or more metals, other conductive materials, or combinations thereof. As used herein, the term metal as in metal interconnect line is intended to encompass alloys, stacks, and other combinations of one or more metals as well as zero or more non-metals (e.g., alloying materials). Commonly, the interconnects are formed as one or more patterned layers over a substrate having the photodetector array and the peripheral circuit(s).

Figure 2:
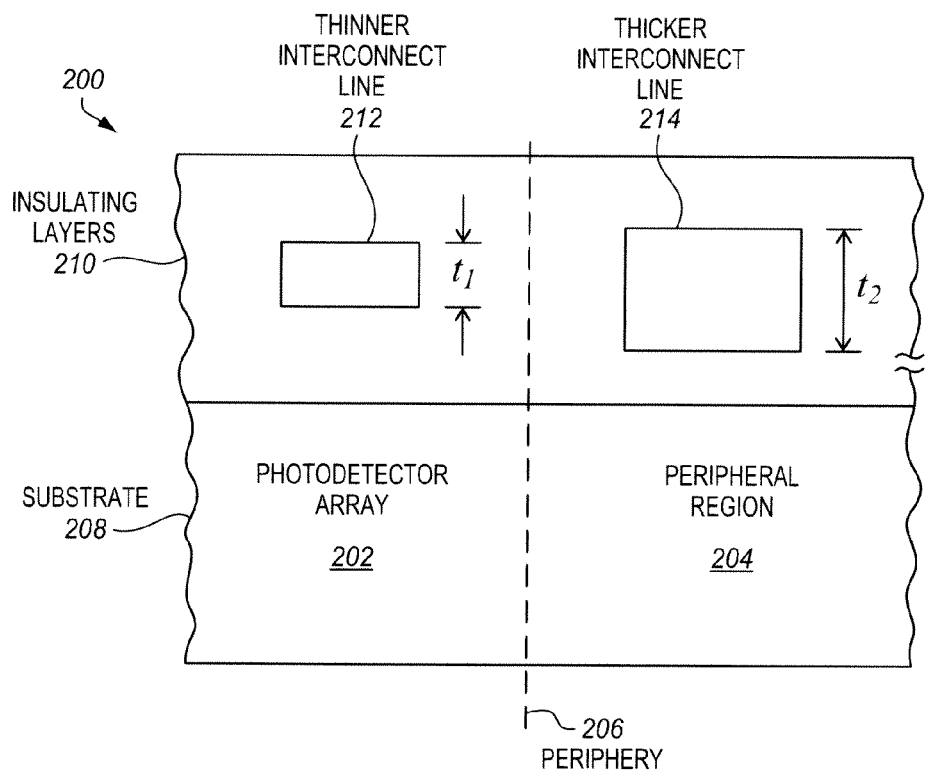
FIG. 2 is a block diagram of a cross-sectional view taken at a periphery of an embodiment of a photodetector apparatus.

FIG. 2 is a block diagram of a cross-sectional view taken at a periphery 206 of an embodiment of a photodetector apparatus 200. The cross-sectional view is taken at the line 2-2 shown in FIG. 1.

The photodetector apparatus includes a photodetector array 202, and a peripheral region 204 located at or along the periphery 206 of the photodetector array. The periphery region may have one or more periphery circuits (not shown). As previously mentioned, various different types of conventional photodetector arrays, peripheral regions, and peripheral circuits are suitable. To avoid obscuring the description, details regarding the internal configuration of the photodetector array and the peripheral circuit(s) will not be discussed, although such details are widely available in the public literature.

In one or more embodiments, the photodetector array 202 and the peripheral region 204 may represent different regions of a substrate 208. In one or more embodiments, the substrate may represent a silicon die, a silicon wafer, or another semiconductor substrate.

One or more insulating or dielectric layers 210 are formed or disposed over the substrate 208. Interconnects 212, 214 are disposed within the one or more insulating or dielectric layers. To avoid obscuring the description, only a single layer or level of interconnects is shown, although two or more different layers or levels of interconnect may optionally be included.

As shown in the illustrated embodiment, the apparatus includes a first, thinner interconnect line 212, and a second, thicker interconnect line 214. The thinner interconnect line 212 corresponds to (e.g., as shown is either directly over or alternatively may be directly under) the photodetector array 202. The thicker interconnect line 214 corresponds to (e.g., is either directly over or directly under) the peripheral region 204. The terms "thinner" and "thicker" are used herein as relative terms, and are to be interpreted such that the interconnect lines are "thinner" and "thicker" relative to one another. In other words, the thinner interconnect line is thinner than the thicker interconnect line. The interconnect lines may both be part of a common contiguous lithographically patterned conductive layer.

As shown in the illustration, the thinner interconnect line has a first thickness (t1), and the thicker interconnect line has a second thickness (t2). Typically, the thinner interconnect line is from about 20% to about 90% as thick as the thicker interconnect line. Often the thinner interconnect line is from about 25% to about 80% as thick as the thicker interconnect line. In some cases, the thinner interconnect line is from about 30% to about 70% as thick as the thicker interconnect line.

As will be explained further below, the different thicknesses for the thinner and thicker interconnect lines may offer certain advantages. Without limitation, in one or more embodiments, the thinner interconnect line 212 corresponding to the photodetector array 202 may help to reduce parasitic capacitance compared to if the line were thicker, while the thicker interconnect line 214 corresponding to the peripheral region 204 may help to provide higher electrical conductivity (or less electrical resistance) compared to if the line were thinner. Advantageously, decreasing the parasitic capacitance helps to increase the conversion gain, which may help to increase the sensitivity of the photodetector apparatus. Avoiding the increase in electrical resistance for the interconnect line corresponding to the peripheral region may be beneficial, for example, due to a higher electrical current conveyed through this interconnect line.

A brief discussion of parasitic capacitance may be helpful. During operation of the photodetector apparatus, parasitic capacitance may exist in the interconnects. The term parasitic capacitance generally refers to a typically unavoidable and generally unwanted capacitance that exists between closely spaced conductors, such as interconnects as a result of their proximity to one another.

Figure 3:
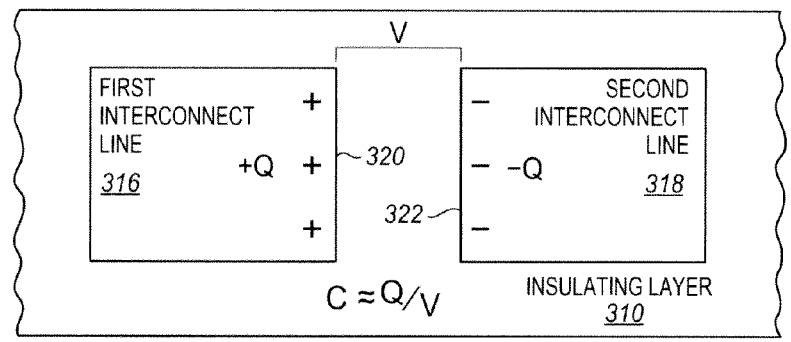
FIG. 3 is a block diagram illustrating an embodiment of parasitic capacitance between a first interconnect line and a second interconnect line disposed within an insulating or dielectric layer.

FIG. 3 is a block diagram illustrating an embodiment of parasitic capacitance between a first interconnect line 316 and a second interconnect line 318 disposed within an insulating or dielectric layer 310. The two interconnect lines are shown in cross-section and extend into the plane of the page. A first elongated rectangular rightmost surface 320 of the first interconnect line opposes, faces, and is substantially parallel to, a second elongated rectangular leftmost surface 322 of the second interconnect line.

Parasitic capacitance approximately measures the amount of electrical energy separated or stored on the opposing surfaces 320, 322 for a given voltage difference across the interconnect lines 316, 318. A voltage difference (V) exists across the interconnect lines. As viewed, the rightmost surface 320 of the first interconnect line stores a net positive electrical charge (+Q), and the leftmost surface 322 of the second interconnect line stores a net negative electrical charge (−Q). For an ideal parallel plate capacitor having parallel conductive plates, when electrical charge of Q exists on the plates, and a voltage difference (V) exists across the plates, the capacitance may be approximated by $C=(Q)/V$.

The parasitic capacitance stores electrical charge and is generally undesirable because the storage of the electrical charge effectively ties up or consumes some of the charge generated during photodetection, which would otherwise be used for image/video generation or the other intended purpose of the photodetector array. Looking at it another way, the parasitic capacitance tends to detract from the conversion gain and/or the sensitivity of the photodetector array. The conversion gain is a conversion factor associated with converting charge generated by photodetection to voltage as a readout signal. As previously mentioned, in small pixels having relatively small areas available for collection of light, the amount of charge generated during photodetection is already relatively low, and the amount of charge consumed by parasitic capacitance may tend to be even more significant. Accordingly, it is generally desirable to reduce the amount of parasitic capacitance, especially for small pixels.

The amount of parasitic capacitance typically increases approximately directly proportionally with increasing surface area of the opposing surfaces. In addition, the amount of parasitic capacitance typically decreases with increasing separation distance between the opposing surfaces. Accordingly, parasitic capacitance may be reduced by reducing the area of a surface experiencing parasitic capacitance or increasing a separation distance of a surface experiencing parasitic capacitance from a corresponding capacitive surface.

Figure 4:
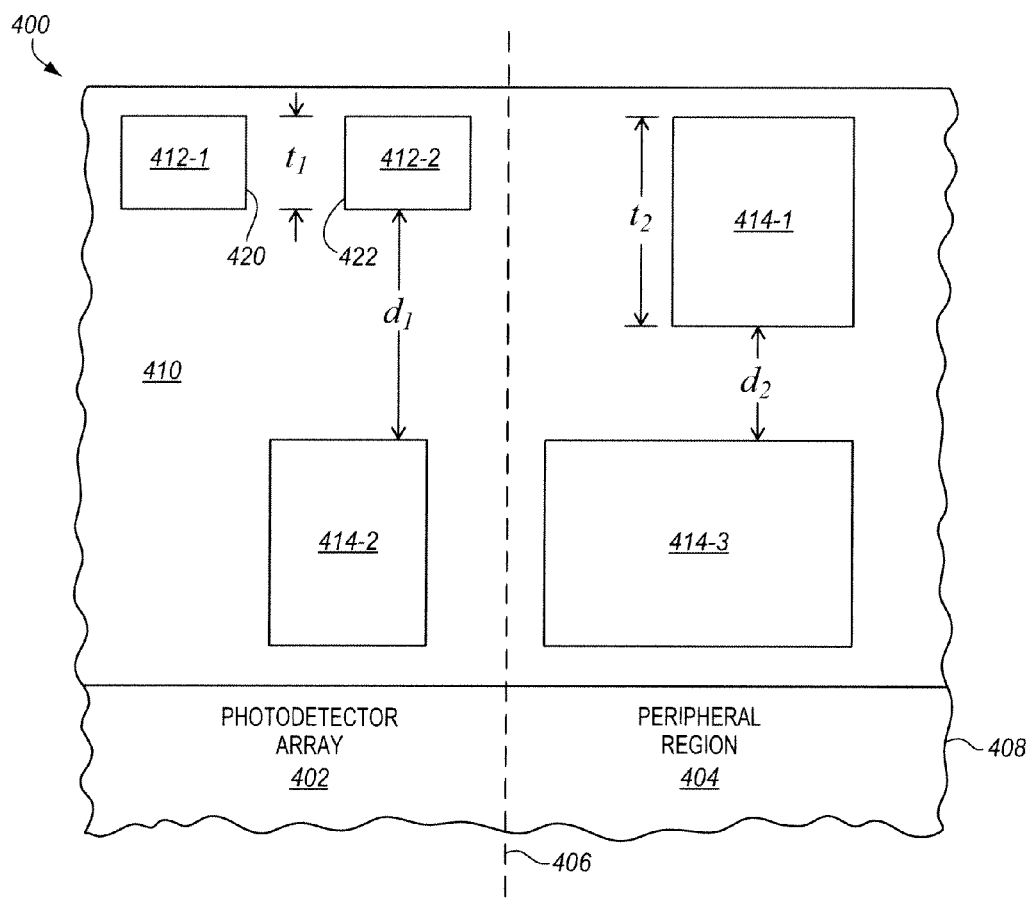
FIG. 4 is a block diagram of a cross-sectional view taken at a periphery of an embodiment of a photodetector apparatus that shows how thinner interconnect lines corresponding to a photodetector array provide lower inter-layer and intra-layer parasitic capacitances.

FIG. 4 is a block diagram of a cross-sectional view taken at a periphery 406 of an embodiment of a photodetector apparatus 400 that shows how thinner interconnect lines 412 provide lower inter-layer and intra-layer parasitic capacitances.

The apparatus includes a substrate 408 having a photodetector array 402 and a peripheral region 404. One or more insulating layers 410 overlie the substrate.

Two levels or layers of interconnects 412, 414 are disposed within the one or more insulating layers. An upper level or layer of interconnects includes a first interconnect line 412-1, a second interconnect line 412-2, and a third interconnect line 414-1. The first, second, and third interconnect lines may be different parts of a common contiguous upper lithographically patterned layer. A lower level or layer of interconnects includes a fourth interconnect line 414-2 and a fifth interconnect line 414-3. The fourth and fifth interconnect lines may be different parts of a common lower patterned layer. The first, second, and fourth interconnect lines correspond to and overlie the photodetector array. The third and fifth interconnect lines correspond to and overlie the peripheral region.

Each of the first and second interconnect lines 412-1, 412-2 have a first thickness (t1). The third interconnect line 414-1 has a second thickness (t2), which is thicker than the first thickness (t1).

The thinner first and/or second interconnect lines 412-1, 412-2 may have lower inter-layer (within the same layer) parasitic capacitance than if they were thicker. The interconnect lines are shown in cross-section and extend into the plane of the page. A first elongated generally rectangular rightmost surface 420 of the first interconnect line opposes, faces, and is substantially parallel to, a second elongated generally rectangular leftmost surface 422 of the second interconnect line. The area of the opposed surfaces is approximately equal to the length of the opposed sections of the interconnect lines into the plane of the page multiplied by the thickness of the first and second interconnect lines. Accordingly, decreasing the thicknesses of one or more of the first and second interconnect lines also decreases the area of one or more of the opposed surfaces. Since the amount of parasitic capacitance tends to decrease approximately directly proportionally with decreasing area of the opposing surfaces, decreasing the thickness of the first and second interconnects may help to reduce inter-layer parasitic capacitance.

The thinner second interconnect line 412-2 may also have lower intra-layer (between different layers) parasitic capacitance than if it were thicker. A first separation distance (d1) from the second interconnect line 412-2 in the upper layer of interconnects to the fourth interconnect line 414-2 in the lower layer of interconnects is greater than a second separation distance (d2) from the third interconnect line 414-1 in the upper layer of interconnects to the fifth interconnect line 414-3 in the lower layer of interconnects. Since the amount of parasitic capacitance tends to decrease with increasing separation distance between the opposing surfaces, decreasing the thickness of the second interconnect line may help to reduce the intra-layer parasitic capacitance.

Accordingly, using a thinner interconnect line may help to reduce parasitic capacitance. Reducing the parasitic capacitance may help to increase conversion gain and increase the sensitivity of the photodetector array. This is especially useful for relatively smaller sized pixels.

Certain interconnect lines corresponding to the photodetector array may in some cases tend to have relatively higher amounts of parasitic capacitance. For example, in some apparatus, interconnect lines that connect locally to the floating or shorting node or drain of pixels tend to have relatively higher amounts of parasitic capacitance and may advantageously be made thinner.

As discussed above, a thinner interconnect line corresponding to a photodetector array may help to reduce parasitic capacitance. However, considering the periphery region, in one or more embodiments, it may be advantageous to make an interconnect line that is part of the same contiguous patterned layer relatively thicker than the thinner interconnect line. Decreasing the thickness of an interconnect line may also tend to increase the electrical resistance of the interconnect line by reducing the thickness and/or area available to conduct electrical current through the interconnect line. For some interconnect lines, the increase in electrical resistance may be a worthwhile tradeoff in exchange for the reduced parasitic capacitance, whereas for other interconnect lines it may not. For example, in one or more embodiments, at least one thinner interconnect line corresponding to a photodetector array may have lower electrical current than at least one thicker interconnect line corresponding to a peripheral region and within the same contiguous patterned layer. In the peripheral region some interconnect lines carry relatively higher electrical currents and for these interconnect lines increasing the electrical resistance is undesirable. For the at least one interconnect line corresponding to the peripheral region, which is to have the higher electrical current, reducing the parasitic capacitance may not be as advantageous as providing additional thickness and/or area available to conduct the higher electrical current. Specific examples of peripheral circuitry that may have higher electrical current and benefit from relatively greater interconnect thickness includes electrostatic discharge (ESD) circuits, input/output (I/O) circuits, and power and ground distribution lines, especially relatively long ones.

Figure 5:
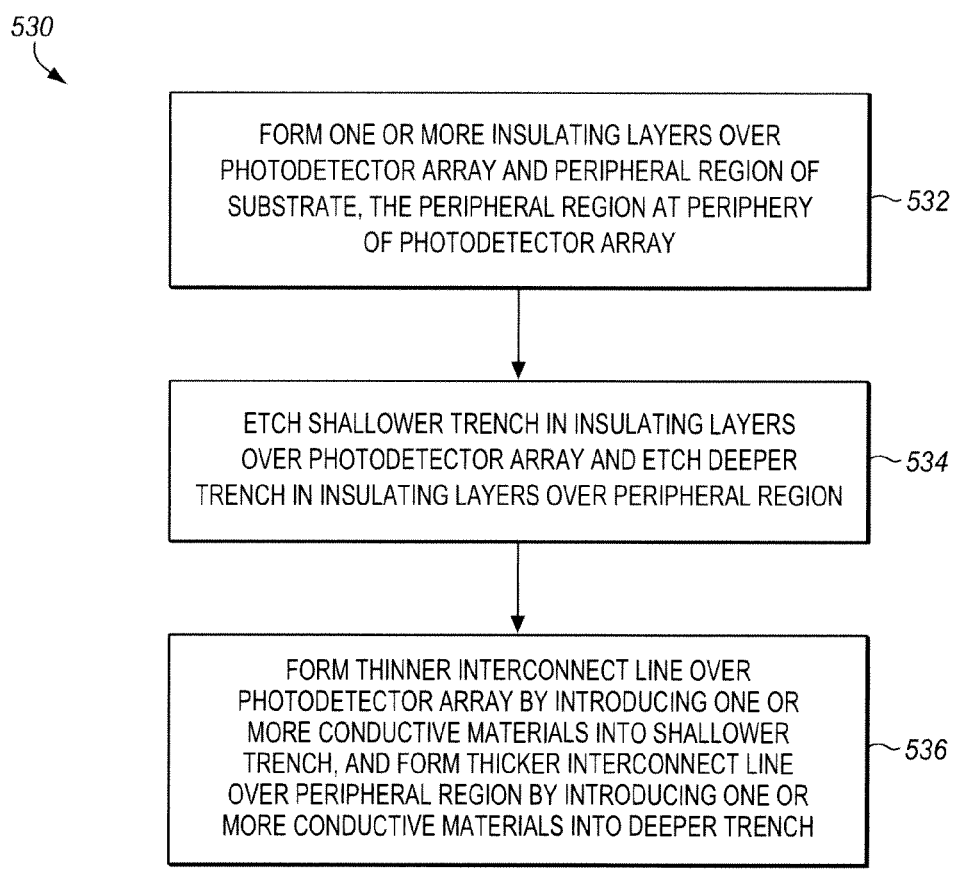
FIG. 5 is a block flow diagram of an embodiment of a method of forming interconnect lines over a photodetector array and a peripheral region.

FIG. 5 is a block flow diagram of an embodiment of a method 530 of forming interconnect lines over a photodetector array and a peripheral region.

The method includes forming one or more insulating or dielectric layers over the photodetector array and the peripheral region, at block 532. In one or more embodiments, the photodetector array and the peripheral region may each be part of a substrate. In one or more embodiments, the substrate may be a semiconductor substrate on which front-end of line semiconductor processing has been performed to form the photodetector array and the peripheral region. In one or more embodiments, the insulating or dielectric layers may each include an oxide of silicon, such as, for example, silicon dioxide ($SiO_2$). Alternatively, other insulating or dielectric layers known in the arts may optionally be used, such as, for example, various known high-k or low-k dielectrics.

A shallower trench may be etched in the one or more insulating layers over the photodetector array, and a deeper trench may be etched in the one or more insulating layers over the peripheral region, at block 534. The terms shallower and deeper are used herein as relative terms. In one or more embodiments, etching the shallow trench may include using an etch stop layer to stop, slow, or delay the etch, whereas etching the deeper trench may not involve using the etch stop layer to stop, slow, or delay the etch. As another option, in one or more embodiments, a longer etch time may be used to form the deeper trench and a shorter etch time may be used to form the shallower trench. As yet another option, in one or more embodiments, a faster etch chemistry may be used to form the deeper trench and a slower etch chemistry may be used to form the shallower trench.

Referring again to FIG. 5, a thinner interconnect line may be formed over the photodetector array by introducing one or more conductive materials into the shallower trench, and a thicker interconnect line may be formed over the peripheral region by introducing one or more conductive materials into the deeper trench, at block 536. A few representative examples of suitable conductive materials include, but are not limited to copper, aluminum, tungsten, titanium, molybdenum, cobalt, other metals or alloys, and combinations thereof.

FIG. 6A-6I are cross-sectional views of substrates at various stages of an embodiment of a method of forming interconnect structures over a photodetector array and peripheral region. This method generally follows a dual damascene process with certain modifications discussed below.

Figure 6A:
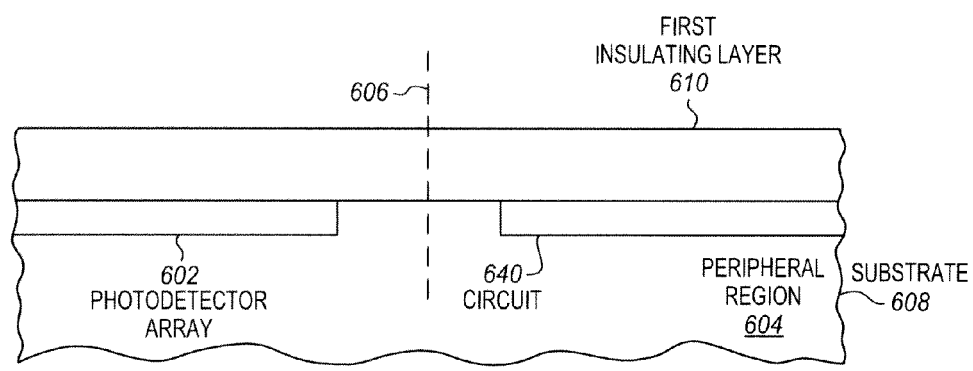
FIG. 6A-6I are cross-sectional views of substrates at various stages of an embodiment of a method of forming interconnect structures over a photodetector array and peripheral region.

FIG. 6A shows depositing or otherwise forming a first insulating layer 610 over a substrate 608. The substrate has a photodetector array 602 and a peripheral region 604 at a periphery 606 of the photodetector array. The peripheral region may have a peripheral circuit 640. In one or more embodiments, the substrate may be a semiconductor substrate after front-end of line semiconductor processing has been performed to form the photodetector array and the peripheral circuit. In one or more embodiments, the substrate may represent a wafer having a plurality of photodetector arrays, each to reside on a different chip after dicing.

In one or more embodiments, the first insulating layer 610 may include an oxide of silicon, such as, for example, silicon dioxide ($SiO_2$). Examples of suitable ways of forming a layer including an oxide of silicon (e.g., $SiO_2$) include, but are not limited to, chemical vapor deposition (CVD), plasma enhanced CVD (PECVD), high-density plasma CVD (HD-PCVD), and the like. Alternatively, the first insulating layer may include a low-k dielectric having a dielectric constant lower than silicon dioxide, which is about 3.9. Using a low-k dielectric may further help to reduce parasitic capacitance. Examples of low-k dielectrics include, but are not limited to, fluorine doped silicon dioxide, carbon doped silicon dioxide, porous silicon dioxide, nanoglass, porous carbon doped silicon dioxide, porous SiLK resin, other porous dielectrics, spin-on organic polymeric dielectrics, and spin-on silicone based polymeric dielectric (e.g., hydrogen silsesquioxane (HSQ) and methylsilsesquioxane (MSQ)). Alternatively, the first insulating layer may include a high-k dielectric having a dielectric greater than that of silicon dioxide (e.g., barium strontium titanate or hafnium oxide). The layers of these various dielectric materials may be formed by conventional methods.

Figure 6B:
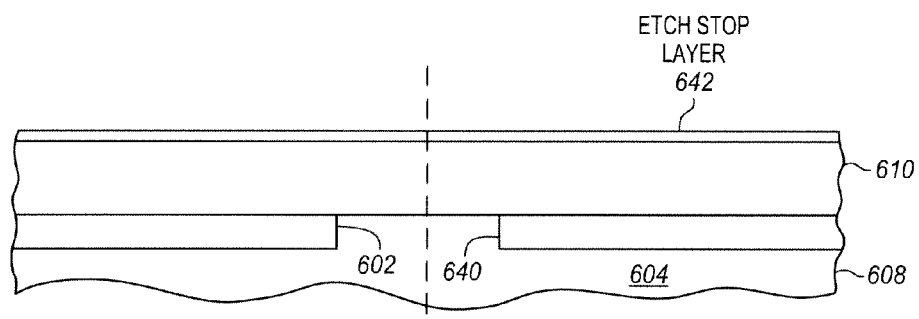

FIG. 6B shows depositing or otherwise forming a blanket etch stop layer 642 over the entire first insulating layer 610 of FIG. 6A. The blanket etch stop layer includes a material to give the layer a lower etch rate than the first insulating layer 610. By way of example, in one particular embodiment, if the first insulating layer includes silicon dioxide ($SiO_2$), the blanket etch stop layer may include a nitride of silicon, such as, for example, silicon nitride ($Si_3N_4$). A layer of silicon nitride may be formed by chemical vapor deposition (CVD), for example. Various other etch stop materials are also suitable. The blanket etch stop layer is over both the photodetector array 602 where the shallower trench is to be etched, and over the periphery region 604 where the deeper trench is to be etched.

Figure 6C:
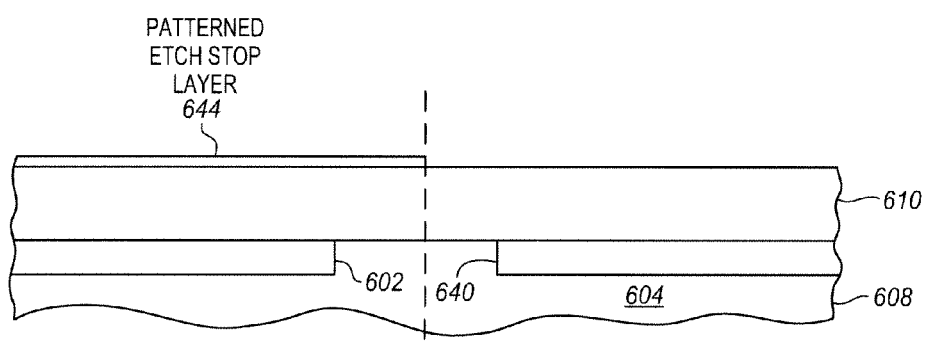

FIG. 6C shows a patterned etch stop layer 644 formed by removing a first portion of the blanket etch stop layer 642 of FIG. 6B from over the peripheral region 604, while leaving a second portion 644 of the blanket etch stop layer 642 over the photodetector array 602. By way of example, in one or more embodiments, the first portion of the blanket etch stop layer may be removed by photolithography and etching. Representatively, a photoresist layer may be formed over the blanket etch stop layer 642 of FIG. 6B. Then, the photoresist layer may be lithographically patterned and developed so that the photoresist layer remains over the photodetector array and the photoresist layer has been removed from over the peripheral region. Then an etch may be used to remove the exposed first portion of the etch stop layer over the peripheral region. In one or more embodiments, an etch suitable for etching silicon nitride may be used. The photoresist layer over the photodetector array may prevent the etch from removing the second portion of the etch stop layer over the photodetector array where the shallower trench is to be etched.

Figure 6D:
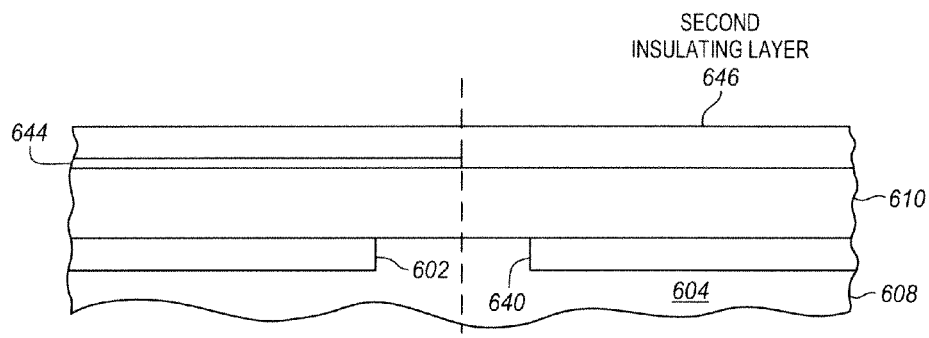

FIG. 6D shows depositing or otherwise forming a second insulating layer 646 over the remaining portion of the patterned etch stop layer 644 and first insulating layer 610 of FIG. 6C. The dielectric materials and methods previously disclosed for the first insulating layer 610 are also suitable for the second insulating layer 646. The second insulating layer may either include the same material as the first insulating layer, or a different material. The second insulating layer may either have the same thickness as the first insulating layer, or a different thickness.

Figure 6E:
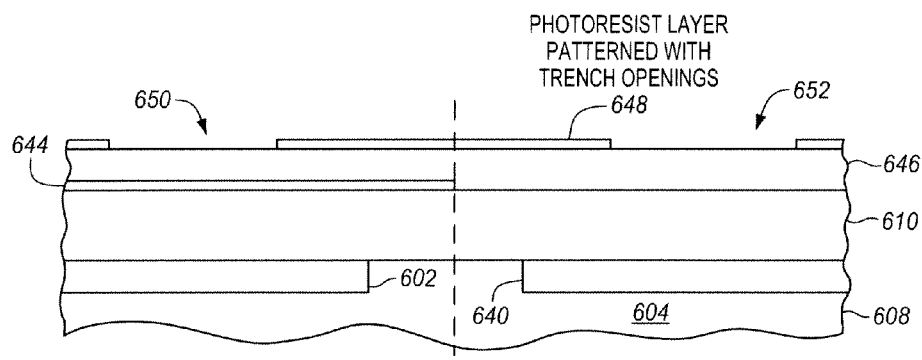

FIG. 6E shows forming a patterned photoresist layer 648 over the second insulating layer 646 of FIG. 6D. The patterned photoresist layer has been patterned to remove portions of the photoresist layer where trenches are to be formed. By way of example, a photoresist layer may be spun or otherwise formed over the second insulating layer. Then, the photoresist layer may be lithographically patterned and developed. During development, portions of the photoresist layer where the trenches are to be etched may be removed. In the illustration, a first portion 650 of the layer has been removed from over photodetector array 602, and a second portion 652 of the layer has been removed from over the peripheral region 604.

Figure 6F:
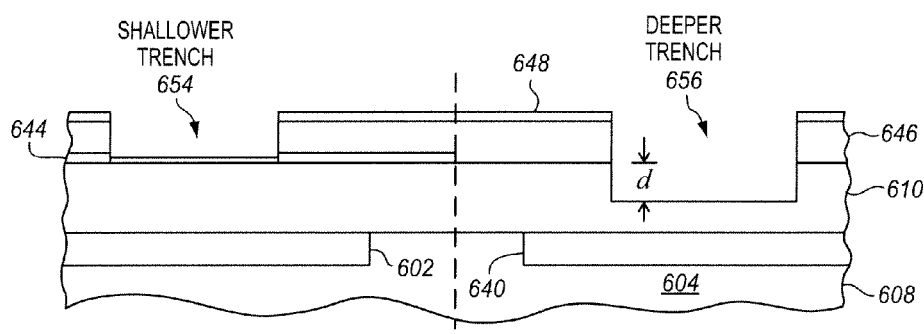

FIG. 6F shows etching or otherwise forming a shallower trench 654 in the second insulating layer 646 over the photodetector array 602 and etching or otherwise forming a deeper trench 656 in the first and second insulating layers 610, 646 over the peripheral region 604 of the substrate of FIG. 6E. As shown, the shallower trench is shallower than the deeper trench by a distance (d). Recall that a portion of the etch stop layer 644 remains over the photodetector array in a region where the shallower trench was formed, but no portion of the etch stop layer remains over the peripheral region in a region where the deeper trench was formed. When the etch of the shallower trench encounters the etch stop layer, the etch rate decreases. In contrast, the etch of the deeper trench does not experience this etch rate decrease. While the etch of the shallower trench is delayed by the etch stop layer, the etch of the deeper trench continues to etch into the first insulating layer 610.

As shown, in one or more embodiments, the etch to form the shallower trench 654 may stop at or within the etch stop layer 644. As shown, in such embodiments, at least a portion of the etch stop layer 644 may remain directly under the shallower trench 654. Alternatively, in one or more embodiments, the etch to form the shallower trench may etch all of the way through the etch stop layer. In such embodiments, a bottom surface of the shallower trench may be below a bottom surface of the etch stop layer. Etching through the etch stop layer tends to reduce the inter-layer parasitic capacitance, but is not required. An embodiment of a substrate in which the etch to form the shallower trench has etched all of the way through the etch stop layer is shown below in FIG. 7.

Using the etch stop layer is not the only way to form a shallower trench and a deeper trench. Another option is to perform a shorter etch to form the shallower trench and a longer etch to form the deeper trench. Yet another option is to use different etch chemistries with different etch rates (e.g., a slower etch rate to form the shallower trench and a faster etch rate to form the deeper trench).

Figure 6G:
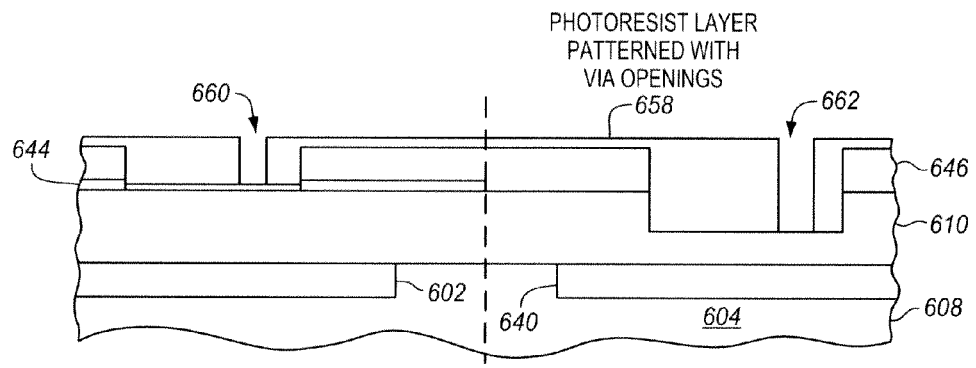

FIG. 6G shows forming a patterned photoresist layer 658 over the substrate of FIG. 6F where the patterned photoresist layer has been patterned to define a first via opening 660 within the shallower trench and a second via opening 660 within the deeper trench. By way of example, a photoresist layer may be formed over the second insulating layer. The photoresist layer may fill the trenches. Then, the photoresist layer may be lithographically patterned and developed. During development, portions of the photoresist layer may be removed at the intended locations of the via openings. In the illustration, a first portion has been removed over the photodetector array within the shallower trench, and a second portion has been removed over the peripheral region within the deeper trench.

Figure 6H:
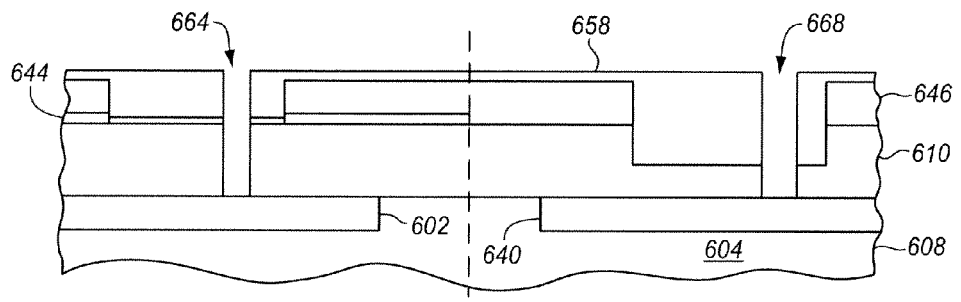

FIG. 6H shows etching or otherwise forming a first via opening 664 in the first insulating layer 610 over the photodetector array 602 and etching or otherwise forming a second via opening 668 in the first insulating layer 610 over the peripheral region 604 of the substrate of FIG. 6G. The first and second via openings may each stop or terminate at contacts of the photodetector array and peripheral circuit, respectively. The patterned photoresist layer may then be stripped away or otherwise removed.

FIGS. 6E-6H illustrate a so-called via-last process, in which trenches are masked and etched before via openings are masked and etched. In one or more alternate embodiments, a so-called via-first process may be used instead, in which the via openings are masked and etched before the trenches are masked and etched. At least conceptually, the operations shown in FIGS. 6G-6H may be performed before the operations shown FIGS. 6E-6F.

Figure 6I:
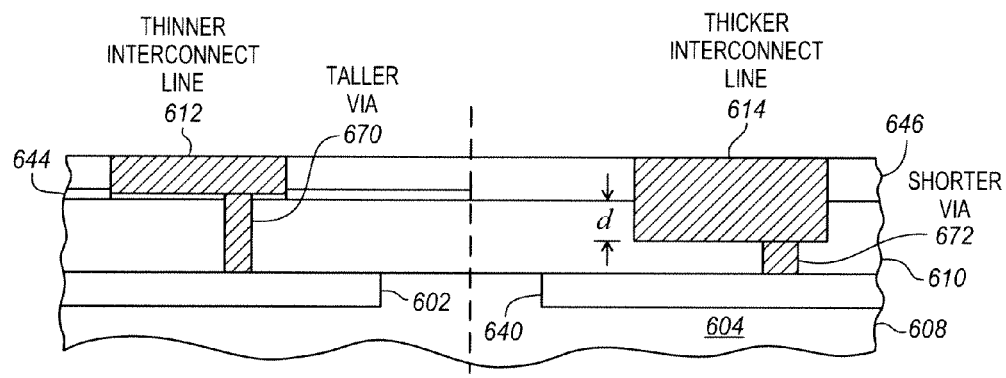

FIG. 6I shows forming interconnect lines 612, 614 and vias 670, 672 in the trenches 654, 656 and via openings 664, 668 of FIG. 6H after removing the patterned photoresist layer 658. In particular, a thinner interconnect line 612 is formed in the shallower trench 654, and a thicker interconnect line 614 is formed in the deeper trench 656. As shown, the thicker interconnect line is thicker than the thinner interconnect line by a distance (d). In addition, a taller via 670 is formed under the thinner interconnect line 612, and a shorter via 672 is formed under the thicker interconnect line 614. As shown, the taller via is taller than the shorter via by approximately the same distance (d).

The interconnect lines and vias may be formed by depositing, plating, or otherwise introducing metals or other conductive materials into the trenches. In one or more embodiments, conductive material may be introduced into the trenches and via openings during the same processing operations. In one or more embodiments, a bulk of each of the interconnect lines may include a copper material, although this is not required. Representatively, a thin copper barrier layer may optionally be deposited on the inner surfaces of the trenches and openings, such as, for example, by CVD or Physical Vapor Deposition (PVD). Then, a thin copper seed layer may optionally be deposited over the copper barrier layer, such as, for example, by CVD or PVD. Then, copper or a copper material may be electroplated, electrolessly plated, otherwise plated, or otherwise introduced into the trenches over the thin copper seed layer to substantially fill the trenches. This is just one example. Aluminum or various other conductive materials may optionally be used instead of copper.

Planarization, such as, for example, by Chemical Mechanical Polishing (CMP), may optionally be used to remove any excess copper or other conductive material outside of the trenches and/or to achieve a more planar top surface. In the illustration, the thinner and thicker interconnect lines have substantially coplanar top surfaces.

Figure 7:
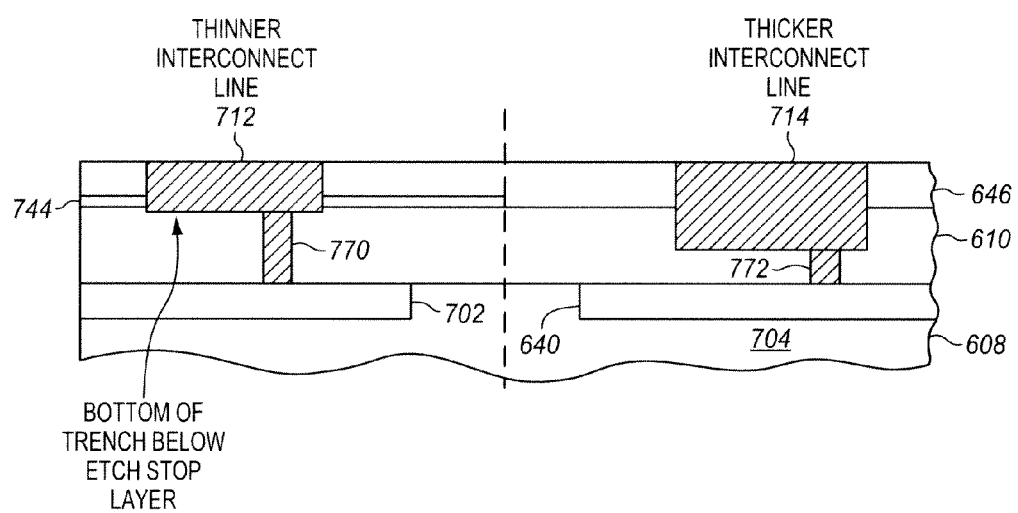
FIG. 7 is a cross-sectional view of an alternate embodiment in which a thinner interconnect line is formed in a trench etched through an etch stop layer.

FIG. 7 is a cross-sectional view of an alternate embodiment having thinner and thicker interconnect structures 712, 714 formed over a photodetector array 702 and peripheral region 704, respectively. In this embodiment, a shallow trench for the thinner interconnect line 712 has been etched all the way through an etch stop layer 744. The thinner interconnect line 712 formed in the trench has a bottom surface at the bottom of the trench that is below a bottom surface of the etch stop layer 744. Etching through the etch stop layer tends to further reduce the inter-layer parasitic capacitance, but is not required. Also shown are a taller via 770 and a shorter via 772.

For simplicity, in FIGS. 6A-6I and FIG. 7, only a single thinner interconnect line and a single thicker interconnect line have been shown and described. In one or more embodiments, the thinner and thicker interconnect lines may be different parts of a common patterned layer, in which a thickness of at least a portion, most, or all of the patterned layer over or corresponding to the photodetector array is less than a thickness of at least a portion, most, or all of the patterned metallization layer over or corresponding to the peripheral region.

Additionally, for simplicity, only a single layer or level of interconnect has been shown and described. It is to be appreciated that there may be two or more levels of interconnect, and that one or more, most, or all of these levels of interconnect may have a thinner interconnect over or corresponding to the photodetector array and a thicker interconnect over or corresponding to the peripheral region. In one or more embodiments, simulations, other calculations, or other analysis may be used to decide which interconnect line(s) corresponding to the photodetector array to make thinner and which interconnect line(s) corresponding to the peripheral region to make thicker. For example, parasitic capacitance and electrical currents may be estimated or predicted. These estimates or predictions may be used to decide which interconnect line(s) corresponding to the photodetector array should be made thinner and which interconnect line(s) corresponding to the peripheral region should be made thicker to achieve the best performance improvement.

Embodiments of the invention may be used for either front side illuminated (FSI) and back side illuminated (BSI) photodetector apparatus. In the case of BSI, there is more freedom to increase the thickness of the interconnects in the periphery.

Figure 8:
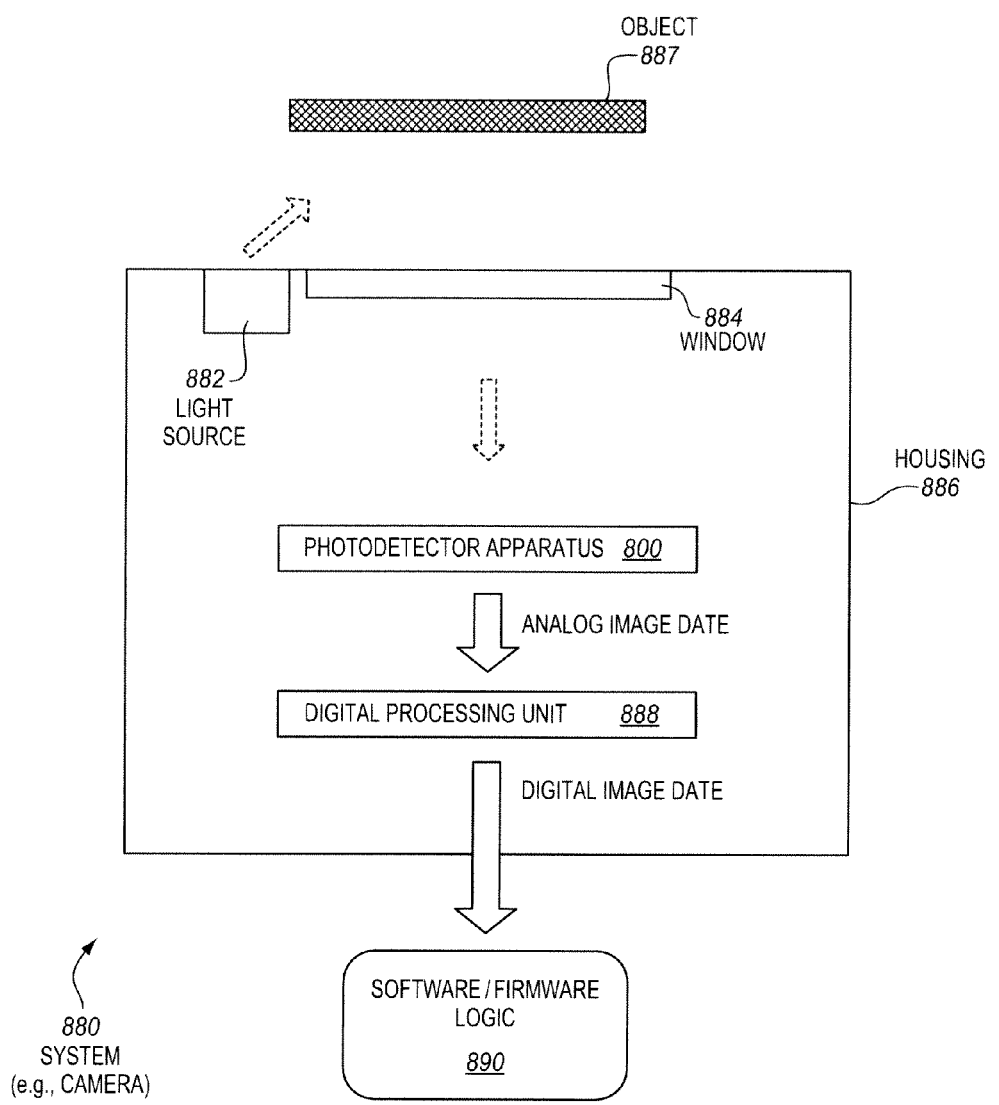
FIG. 8 is a block diagram illustrates an embodiment of an illumination and image capture system incorporating a photodetector apparatus.

FIG. 8 is a block diagram illustrates an embodiment of an illumination and image capture system 880 incorporating a photodetector apparatus 800. In various embodiments, the system may represent or be incorporated within a digital camera, a digital camera phone, a web camera, a security camera, an optical mouse, an optical microscope, to name just a few examples.

The system includes a light source 882, such as, for example, multicolor light emitting diodes (LEDs) or other semiconductor light sources. The light source may transmit light through a cover or window 884 of a housing 886 to an object 887 being imaged.

At least some light reflected by the object may be returned to the system through the cover to photodetector apparatus 800. The photodetector apparatus may sense the light and may output analog image data representing the light or image.

A digital processing unit 888 may receive the analog image data. The digital processing unit may include analog-to-digital (ADC) circuitry to convert the analog image data to corresponding digital image data.

The digital image data may be subsequently stored, transmitted, or otherwise manipulated by software/firmware logic 890. The software/firmware logic may either be within the housing, or as shown external to the housing.

This system is only one illustrative example. A wide variety of other systems are also contemplated.

In the description and claims, the terms "coupled" and "connected," along with their derivatives, may be used. These terms are not intended as synonyms for each other. Rather, "connected" means that two or more elements are in direct physical or electrical contact with each other. "Coupled" may mean that two or more elements are in direct physical or electrical contact. However, "coupled" may instead mean that two or more elements are not in direct contact with each other, but yet still co-operate or interact with each other, such as, for example, through one or more intervening components or structures. For example, an interconnect line may be coupled with a photodetector through one or more intervening structures, such as a via.

In the description above, for the purposes of explanation, numerous specific details have been set forth in order to provide a thorough understanding of the embodiments of the invention. It will be apparent however, to one skilled in the art, that other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description.

It will also be appreciated, by one skilled in the art, that modifications may be made to the embodiments disclosed herein, such as, for example, to the sizes, shapes, configurations, forms, functions, materials, and manner of operation, and assembly and use, of the components of the embodiments. All equivalent relationships to those illustrated in the drawings and described in the specification are encompassed within embodiments of the invention.

For simplicity and clarity of illustration, elements illustrated in the figures have not necessarily been drawn to scale. For example, the dimensions of some of the elements are exaggerated relative to other elements. Where considered appropriate, reference numerals, or terminal portions of reference numerals, have been repeated among the figures to indicate corresponding or analogous elements, which unless otherwise specified may have similar or analogous characteristics.

Reference throughout this specification to "one embodiment", "an embodiment", or "one or more embodiments", for example, means that a particular feature may be included in the practice of the invention. Similarly, in the description various features are sometimes grouped together in a single embodiment, figure, or description thereof, for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. An apparatus comprising:
    a photodetector array;
    a peripheral region at a periphery of the photodetector array, wherein the peripheral region is disposed around the photodetector array;
    a thinner interconnect line formed in the photodetector array disposed within one or more insulating layers;
    a thicker interconnect line formed in the peripheral region disposed within the one or more insulating layers;
    a taller via disposed below and coupled to the thinner interconnect line; and
    a shorter via disposed below and coupled to the thicker interconnect line, wherein the thicker interconnect line is thicker than the thinner interconnect line by a distance d, a depth of the taller via being equivalent to a sum of a depth of the shorter via and the distance d, and wherein the longer via is coupled to the photodetector array and the shorter via is coupled to a peripheral circuit within the peripheral region, the peripheral circuit and the photodetector array disposed at a same level within a substrate,
    wherein a top of the thinner interconnect line and a top of the thicker interconnect line are at a common interconnect level.

2. The apparatus of claim 1, wherein the thinner interconnect line has a greater separation distance from an interconnect line directly below the thinner interconnect line than the thicker interconnect line has to an interconnect line directly below the thicker interconnect line.

3. The apparatus of claim 1, further comprising an etch stop layer under a region having the thinner interconnect line, wherein the etch stop layer is not under a region having the thicker interconnect line.

4. The apparatus of claim 3, further comprising at least a portion of the etch stop layer directly under the thinner interconnect line, wherein there is no etch stop layer directly under the thicker interconnect line.

5. The apparatus of claim 3, wherein there is no etch stop layer directly under the thinner interconnect line, and wherein a bottom surface of the thinner interconnect line is below a bottom surface of the etch stop layer.

6. The apparatus of claim 3, wherein the etch stop layer is over at least most of the photodetector array and is omitted over at least most of the peripheral region.

7. The apparatus of claim 3, wherein the one or more insulating layers comprise an oxide of silicon, and wherein the etch stop layer comprises a nitride of silicon.

8. The apparatus of claim 1, wherein a top surface of the thinner interconnect line is substantially coplanar with a top surface of the thicker interconnect line.

9. The apparatus of claim 1, wherein the thinner interconnect line is one of over and under the photodetector array and the thicker interconnect line is one of over and under the peripheral region.

10. The apparatus of claim 1, wherein the thinner interconnect line is electrically connected to carry a lesser electrical current than the thicker interconnect line.

11. The apparatus of claim 1, wherein the thinner interconnect line is from 20% to 90% as thick as the thicker interconnect line.

12. The apparatus of claim 11, wherein the thinner interconnect line is from 30% to 70% as thick as the thicker interconnect line.

13. The apparatus of claim 1, wherein the photodetector array comprises a backside-illuminated (BSI) image sensor array.

14. The apparatus of claim 1, wherein the photodetector array comprises a frontside-illuminated (FSI) image sensor array.

15. An image sensor comprising:
    a photodetector array;
    a peripheral region at a periphery of the photodetector array;
    a patterned metallization layer over the photodetector array and over the peripheral region,
    wherein a thickness of at least a portion of the patterned metallization layer over the photodetector array is less than a thickness of at least a portion of the patterned metallization layer over the peripheral region, wherein a top surface of the portion of the patterned metallization layer over the photodetector array is coplanar with a top surface of the portion of the patterned metallization layer over the peripheral region;

a taller via disposed below and coupled to the portion of the patterned metallization layer over the peripheral region; and a shorter via disposed below and coupled to the portion of the patterned metallization layer over the photodetector array, wherein a termination depth of the taller via and the shorter via is coplanar, and wherein the longer via is coupled to the photodetector array and the shorter via is coupled to a peripheral circuit within the peripheral region.

16. The apparatus of claim 1, wherein the thicker interconnect line is disposed in a deeper trench than the shallower trench that the thinner interconnect line is disposed in, the deeper trench in a second insulating layer and penetrating through a first insulating layer, and wherein the shallower trench lies is in the first insulating layer but not the second insulating layer.

* * * * *